ical Patent No.: US 11,297,273 B2
(45) Date of Patent: Apr. 5, 2022

(12) United States Patent
Sekine et al.

(54) PHOTOELECTRIC CONVERSION APPARATUS

(71) Applicant: CANON KABUSHIKI KAISHA, Tokyo (JP)

(72) Inventors: Hiroshi Sekine, Kawasaki (JP); Hiroaki Sano, Chofu (JP); Hisashi Takado, Kawasaki (JP); Takahiro Yamasaki, Tachikawa (JP); Masahiro Kobayashi, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 16/776,772

(22) Filed: Jan. 30, 2020

(65) Prior Publication Data

US 2020/0252570 A1  Aug. 6, 2020

(30) Foreign Application Priority Data

Feb. 5, 2019 (JP) .............................. JP2019-018988

(51) Int. Cl.
| | |
|---|---|
| *H04N 5/374* | (2011.01) |
| *H01L 27/146* | (2006.01) |
| *H04N 5/3745* | (2011.01) |
| *H04N 5/353* | (2011.01) |
| *H04N 5/378* | (2011.01) |
| *H04N 5/361* | (2011.01) |

(52) U.S. Cl.
CPC ... *H04N 5/37452* (2013.01); *H01L 27/14603* (2013.01); *H04N 5/353* (2013.01); *H04N 5/361* (2013.01); *H04N 5/378* (2013.01)

(58) Field of Classification Search
None
See application file for complete search history.

(56) References Cited

U.S. PATENT DOCUMENTS

| | | | |
|---|---|---|---|
| 7,462,810 B2 | 12/2008 | Kobayashi et al. | |
| 7,928,477 B2 | 4/2011 | Kobayashi et al. | |
| 9,147,708 B2 | 9/2015 | Okita et al. | |
| 9,153,610 B2 | 10/2015 | Kobayashi et al. | |
| 9,538,112 B2 | 1/2017 | Wada et al. | |
| 9,716,849 B2 | 7/2017 | Kobayashi et al. | |

(Continued)

FOREIGN PATENT DOCUMENTS

| | | |
|---|---|---|
| JP | 2017-103727 A | 6/2017 |
| JP | 2017-153069 A | 8/2017 |
| WO | 2007/083704 A1 | 7/2007 |

*Primary Examiner* — Mark T Monk
(74) *Attorney, Agent, or Firm* — Venable LLP

(57) ABSTRACT

A photoelectric conversion apparatus including a plurality of pixels each having: a photoelectric conversion unit; a first charge holding unit; a second charge holding unit; a first gate; and a second gate. In a period when the photoelectric conversion unit is storing charges to be transferred to the first charge holding unit, the potential of the first gate is set to a first potential, and the potential of the second gate is set to a second potential. Both the first potential and the second potential are higher than the potential of the first gate in a period when the charges of the photoelectric conversion unit are transferred to the first charge holding unit and the potential of the second gate in a period when the charges of the photoelectric conversion unit are transferred to the second charge holding unit. The first potential is lower than the second potential.

25 Claims, 13 Drawing Sheets

(56) References Cited

U.S. PATENT DOCUMENTS

| | | |
|---|---|---|
| 9,768,213 B2 | 9/2017 | Soda et al. |
| 9,876,975 B2 | 1/2018 | Yoshida et al. |
| 9,894,295 B2 | 2/2018 | Kawabata et al. |
| 9,900,535 B2 | 2/2018 | Takado |
| 9,900,539 B2 | 2/2018 | Yamasaki et al. |
| 9,912,886 B2 | 3/2018 | Shigeta et al. |
| 10,009,560 B2 | 6/2018 | Kobayashi et al. |
| 10,021,321 B2 | 7/2018 | Kawabata et al. |
| 10,044,992 B2 | 8/2018 | Takado |
| 10,186,532 B2 | 1/2019 | Kobayashi et al. |
| 10,205,894 B2 | 2/2019 | Kawabata et al. |
| 10,477,165 B2 | 11/2019 | Takado |
| 10,498,979 B2 | 12/2019 | Kobayashi et al. |
| 10,535,688 B2 | 1/2020 | Onuki et al. |
| 10,536,653 B2 | 1/2020 | Ikeda et al. |
| 2010/0187401 A1 | 7/2010 | Kawahito |
| 2014/0061436 A1 | 3/2014 | Kobayashi |
| 2017/0163921 A1* | 6/2017 | Tsuboi ............... H04N 5/37452 |
| 2017/0244912 A1 | 8/2017 | Kajimura et al. |
| 2018/0309946 A1 | 10/2018 | Ohya et al. |
| 2018/0374886 A1 | 12/2018 | Iwata et al. |
| 2019/0191121 A1 | 6/2019 | Sekine |
| 2019/0199978 A1 | 6/2019 | Takado |
| 2019/0222733 A1 | 7/2019 | Nishide et al. |
| 2019/0246054 A1 | 8/2019 | Kobayashi et al. |
| 2019/0312071 A1 | 10/2019 | Yamasaki et al. |
| 2020/0099880 A1 | 3/2020 | Kobayashi |
| 2020/0111828 A1 | 4/2020 | Onuki et al. |
| 2020/0137286 A1 | 4/2020 | Takado |

* cited by examiner

PHOTOELECTRIC CONVERSION APPARATUS

BACKGROUND OF THE INVENTION

Field of the Invention

The present invention relates to a photoelectric conversion apparatus which includes a charge holding unit which implements a global electronic shutter operation.

Description of the Related Art

In recent years, CMOS image sensors, which are suitable for low power consumption and high-speed reading, are widely used for such image apparatuses as digital still cameras and digital video cameras. For CMOS image sensors, a CMOS image sensor having a global (simultaneous full pixel) electronic shutter function has been proposed (Japanese Patent Application Publication No. 2017-103727). For this electronic shutter function, a charge holding unit, that holds photoelectric-converted charges for a predetermined time, is disposed in a pixel separately from a photoelectric conversion unit that performs the photoelectric conversion.

In some cases, the photoelectric conversion unit and the charge holding unit in one pixel may hold signals of which corresponding exposure periods are different from each other. In this case, if the light, having light quantity to saturate the photoelectric conversion unit, enters, excessive charges flow into the charge holding unit, and signals, of which exposure periods (frames) are different, mix. As a result, image quality deteriorates. In order to suppress the excessive charges flowing in, the gate of the charge holding unit side may remain constantly ON while the photoelectric conversion unit is storing charges, but dark current increases. Another possibility is disposing an overflow gate in the photoelectric conversion unit, and increasing the potential different between the overflow gate and the gate of the charge holding unit which is holding charges, but the saturation capacity of the photoelectric conversion unit decreases.

With the foregoing in view, it is an object of the present invention to provide a photoelectric conversion apparatus that can reduce deterioration of signal quality caused by the flow of charges into the chart holding unit while suppressing such negative influences as a decrease in saturation capacity and an in increase in dark current.

SUMMARY OF THE INVENTION

The first aspect of the disclosure is a photoelectric conversion apparatus comprising a plurality of pixels, wherein each of the pixels includes: a photoelectric conversion unit that stores charges generated by photoelectric conversion; a first charge holding unit; a second charge holding unit; a first gate configured to transfer charges stored in the photoelectric conversion unit to the first charge holding unit; and a second gate configured to transfer charges stored in the photoelectric conversion unit to the second charge holding unit, and wherein, in a period when the photoelectric conversion unit is storing charges to be transferred to the first charge holding unit, the potential of the first gate is set to a first potential, and the potential of the second gate is set to a second potential; wherein both the first potential and the second potential are higher than the potential of the first gate in a period when the charges of the photoelectric conversion unit are transferred to the first charge holding unit and the potential of the second gate in a period when the charges of the photoelectric conversion unit are transferred to the second charge holding unit; and wherein the first potential is lower than the second potential.

The second aspect of the disclosure is a photoelectric conversion apparatus comprising a plurality of pixels, wherein each of the pixels includes: a photoelectric conversion unit that stores electrons generated by photoelectric conversion; a first charge holding unit; a second charge holding unit; a first gate configured to transfer electrons stored in the photoelectric conversion unit to the first charge holding unit; and a second gate configured to transfer electrons stored in the photoelectric conversion unit to the second charge holding unit; and wherein in a period when the photoelectric conversion unit is storing electrons to be transferred to the first charge holding unit, the potential of the first gate is set to a first potential, and the potential of the second gate is set to a second potential; wherein both the first potential and the second potential are potentials lower than the potential of the first gate in a period when the electrons of the photoelectric conversion unit are transferred to the first charge holding unit and the potential of the second gate in a period when the electrons of the photoelectric conversion unit are transferred to the second charge holding unit; and wherein the first potential is higher than the second potential.

The third aspect of the disclosure is a photoelectric conversion apparatus comprising a plurality of pixels, wherein each of the pixels includes: a photoelectric conversion unit that stores holes generated by photoelectric conversion; a first charge holding unit; a second charge holding unit; a first gate configured to transfer holes stored in the photoelectric conversion unit to the first charge holding unit; and a second gate configured to transfer holes stored in the photoelectric conversion unit to the second charge holding unit, and in a period when the photoelectric conversion unit is storing holes to be transferred to the first charge holding unit, the potential of the first gate is set to a first potential, and the potential of the second gate is set to a second potential; wherein both the first potential and the second potential are potentials higher than the potential of the first gate in a period when the holes of the photoelectric conversion unit are transferred to the first charge holding unit, and the potential of the second gate in a period when the holes of the photoelectric conversion unit are transferred to the second charge holding unit; and the first potential is lower than the second potential.

According to the present invention, deterioration of signal quality caused by the flow of charges into the chart holding unit can be reduced while suppressing such negative influences as a decrease in saturation capacity and an increase in dark current.

Further features of the present invention will become apparent from the following description of exemplary embodiments with reference to the attached drawings.

DESCRIPTION OF THE EMBODIMENTS

Figure 1:
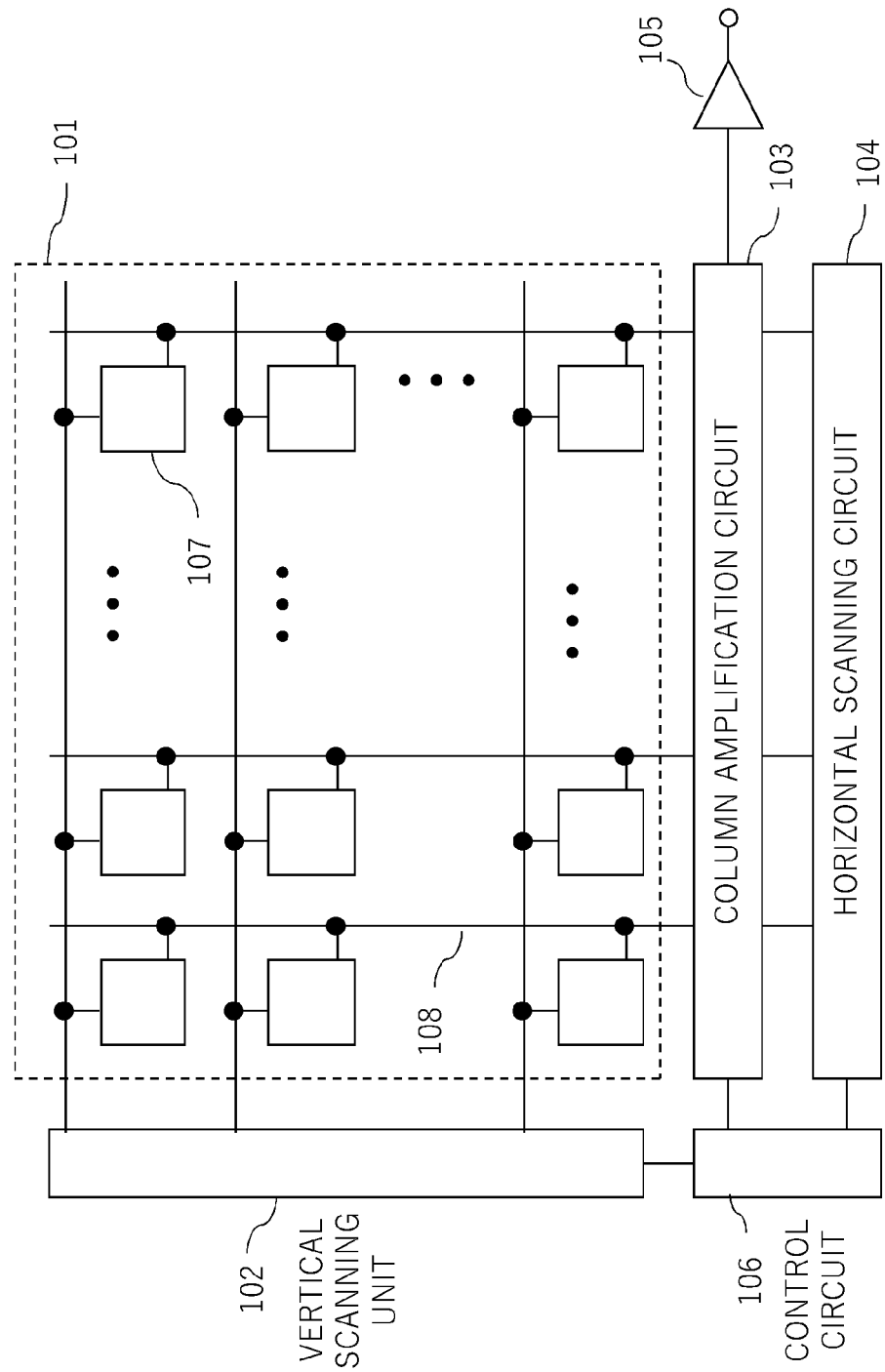
FIG. 1 is a block diagram of a photoelectric conversion apparatus according to Embodiment 1.

Embodiments of the present invention will be described with reference to the drawings. The present invention is not limited to the following embodiments, but may be changed appropriately within a scope not departing from the essence thereof. In the drawings described below, composing elements having the same function are denoted with a same reference sign, and description thereof may be omitted or simplified.

A photoelectric conversion apparatus is a semiconductor device which includes a plurality of pixels to convert light into an electric signal, and is also called a solid-state image pickup element, an image sensor or an imaging apparatus. The photoelectric conversion apparatus includes a CMOS image sensor, a distance measurement sensor (AF sensor) and a photometric sensor (AE sensor). As a preferable application example of the present invention, a configuration example, when the present invention is applied to a CMOS image sensor, will be described below.

Embodiment 1

FIG. 1 is a block diagram depicting a general configuration of a photoelectric conversion apparatus according to Embodiment 1. The photoelectric conversion apparatus includes a pixel unit 101, a vertical scanning circuit 102, a column amplification circuit 103, a horizontal scanning circuit 104, an output circuit 105 and a control circuit 106.

The pixel unit 101 includes a plurality of pixels 107 which are disposed in a matrix. The vertical scanning circuit 102 supplies a control signal which controls a transistor in the pixel 107 to ON (conducting state) or to OFF (non-conducting state). A column signal line 108 is disposed in each column of the pixels 107, and a signal from each pixel 107 in each column is outputted to the respective column signal line 108. The column amplification circuit 103 amplifies a pixel signal outputted to the column signal line 108, and performs the correlated double sampling processing and the like based on a signal at reset and a signal at photoelectric conversion of each pixel 107. The horizontal scanning circuit 104 supplies a switch connected to an amplifier of the column amplification circuit 103 and a control signal to control this switch to ON or OFF. The output circuit 105 is constituted of a buffer amplifier, a differential amplifier and the like, and outputs a pixel signal from the column amplification circuit 103 to a signal processing unit outside the photoelectric conversion apparatus. An AD conversion unit may be disposed in the photoelectric conversion apparatus so as to output digital pixel signals.

Figure 2:
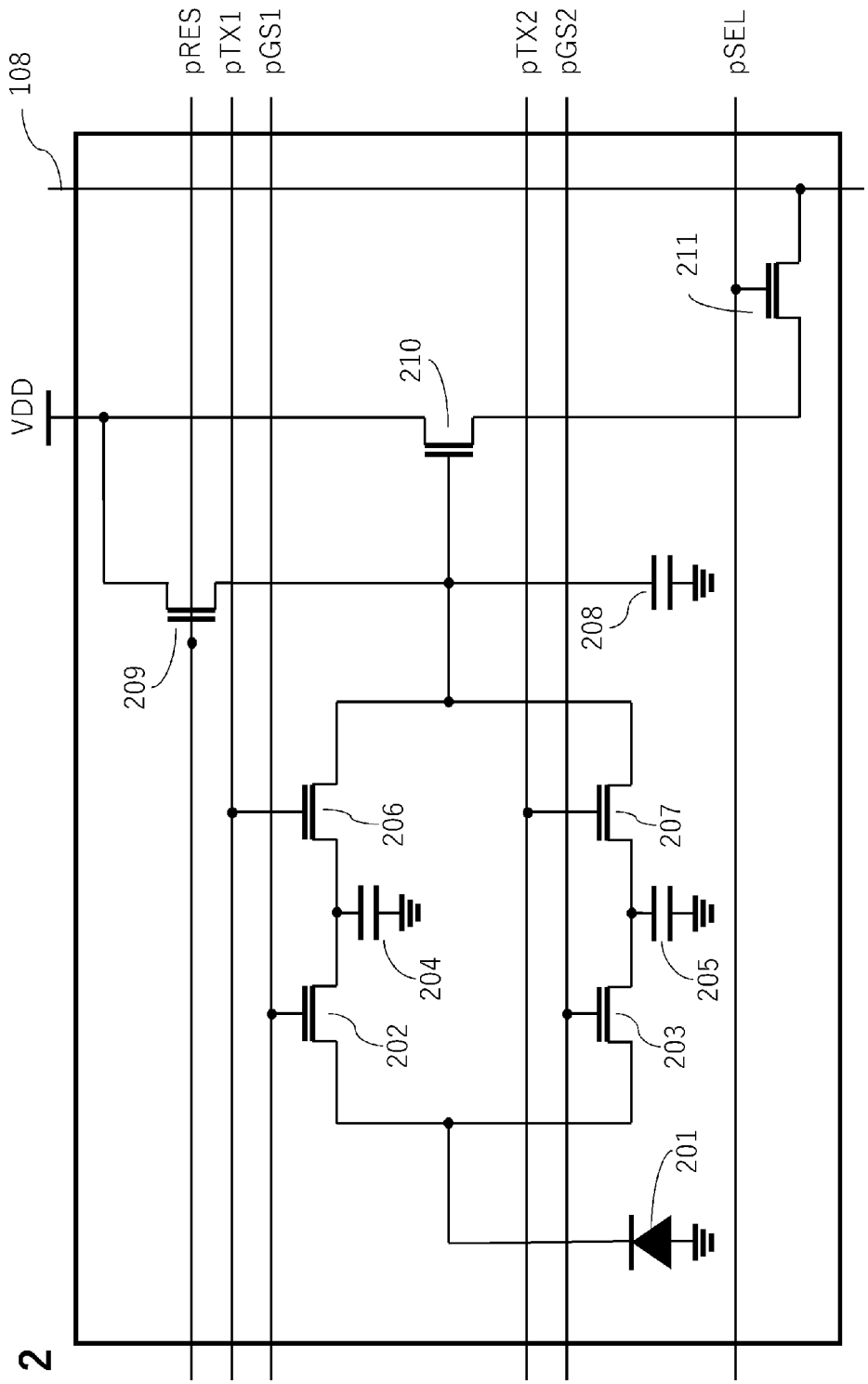
FIG. 2 is an equivalent circuit of a pixel unit according to Embodiment 1.
Figure 3:
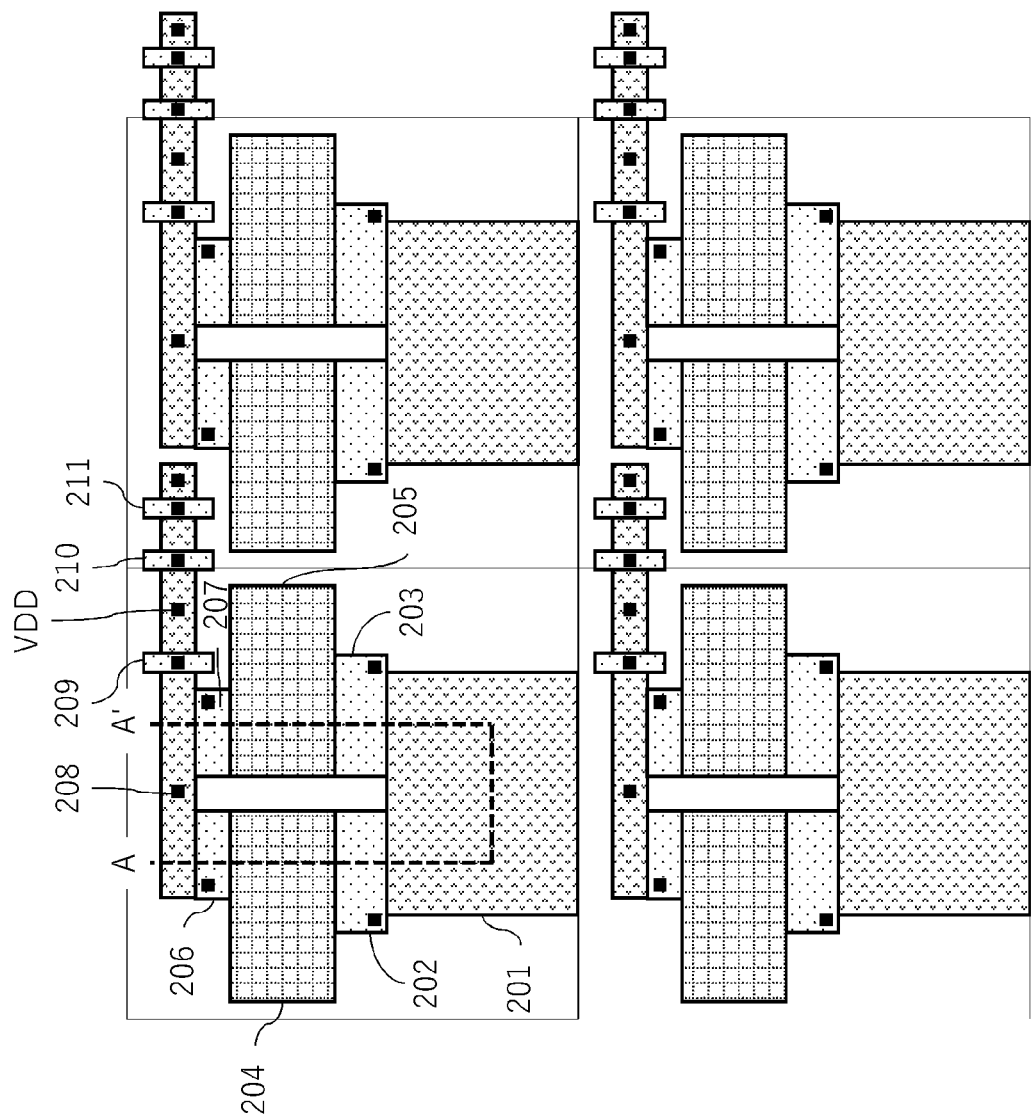
FIG. 3 is a pixel layout according to Embodiment 1.

FIG. 2 indicates an equivalent circuit of a pixel of the photoelectric conversion apparatus. FIG. 3 indicates an example of pixel layout according to Embodiment 1.

The pixel 107 includes a photoelectric conversion unit 201, a first charge holding unit 204, a second charge holding unit 205, a floating diffusion node 208 and an amplification unit 210. The pixel 107 also includes a first GS transfer unit 202, a second GS transfer unit 203, a first TX transfer unit 206, a second TX transfer unit 207, a reset unit 209 and a row selection unit 211, which are configurated by transistors. To the first GS transfer unit 202, the second GS transfer unit 203, the first TX transfer unit 206, the second TX transfer unit 207, the reset unit 209 and the row selection unit 211, the control lines pGS1, pGS2, pTX1, pTX2, pRES and pSEL are connected respectively.

The first GS transfer unit 202, the second GS transfer unit 203, the first TX transfer unit 206 and the second TX transfer unit 207, according to this embodiment, are examples of the first gate, the second gate, the fourth gate and the fifth gate according to the present invention respectively. Also, the amplification unit 210 is an example of the output unit according to the present invention.

The photoelectric conversion unit 201 stores charges generated by incident light. The first GS transfer unit 202 transfers charges of the photoelectric conversion unit 201 to the first charge holding unit 204. The first TX transfer unit 206 transfers the charges of the first charge holding unit 204 to a floating diffusion node 208, which is an input node of the amplification unit 210. In the same manner, the second GS transfer unit 203 transfers the charges of the photoelectric conversion unit 201 to the second charge holding unit 205. The second TX transfer unit 207 transfers the charges of the second charge holding unit 205 to the floating diffusion node 208, which is the input node of the amplification unit 210. The reset unit 209 resets voltage of the floating diffusion node 208. The row selection unit 211 selects a pixel, to which a signal is outputted, in the column signal line 108. The amplification unit 210 outputs a signal based on the charges generated by the incident line, to the column signal line 108 via the row selection unit 211.

In the following description, it is assumed that the photoelectric conversion unit 201 stores electrons as signal charges. It is also assumed that a transistor included in the pixel 107 is an N-type transistor. However the charges stored by the photoelectric conversion unit 201 may be holes, and in this case, the transistor included in the pixel 107 may be a P-type transistor. In other words, the regulation of the conductive type described below may be changed in accordance with the polarity of charges that are handled as signals.

Figure 4:
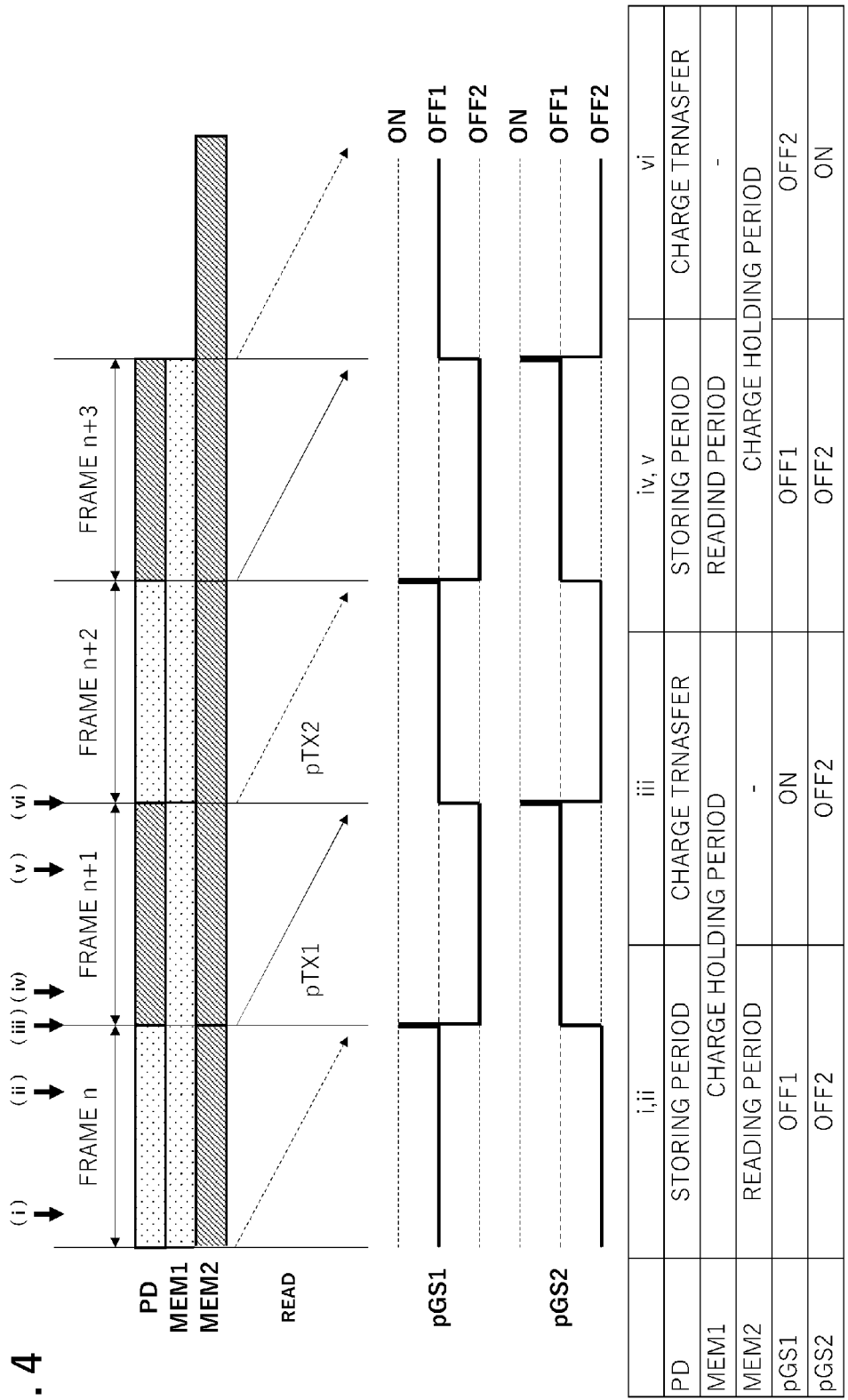
FIG. 4 is a pixel driving diagram according to Embodiment 1.

FIG. 4 indicates driving timings of Embodiment 1 from a certain frame n to frame n+3. In the photoelectric conversion unit (PD), the first charge holding unit (MEM1) and the second charge holding unit (MEM2), the signals held in MEM1 and the signal held in MEM2 are indicated and differentiated by using different hatchings. READ indicates a sequential reading of rows of signals transferred to the charge holding unit, and pGS1 and pGS2 indicate the states of the first GS transfer unit (GS1) and the second GS transfer unit (GS2) respectively. In this embodiment, the gate of the GS transfer unit includes one ON state (ON) and two OFF states (OFF1, OFF2), and the potential under the GS gate has the relationship of OFF1>OFF2. The signal charge is an electron, hence the potential under the GS gate, with respect to the signal charge, is deeper in OFF1 than in OFF2 (height of potential barrier is higher in OFF2 than in OFF1). Here the OFF state is assumed to be controlled by the voltage that is applied to the gate, but is not limited to this. The OFF state control can also be established just the same, even in the case of a pattern of which one side is fixed and the other side has ternary values, for example. The table in FIG. 4 indicates the states at the timings of (i) to (vi).

Figure 5:
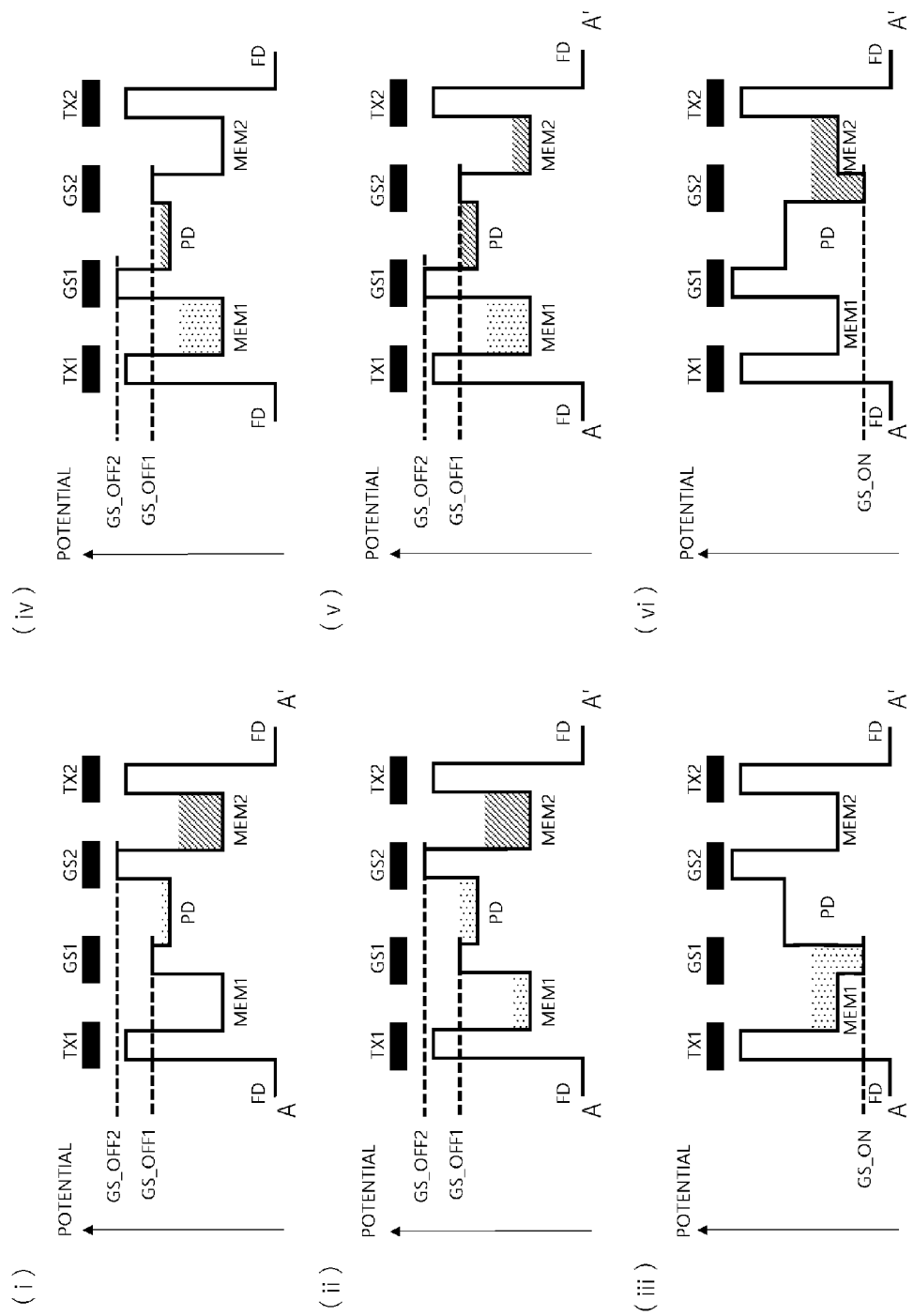
FIG. 5 is a conceptual diagram of the potential of the pixel unit according to Embodiment 1 (A-A' cross-section)

(i) to (vi) in FIG. 5 are conceptual diagrams of the potential of the signal charges in the A-A' cross-section in FIG. 3 at the timings (i) to (vi) in FIG. 4.

FIG. 4 and FIG. 5 indicate the operations when the two charge holding units are used alternately. In other words, the charges which the photoelectric conversion unit 201 stored in frame n, frame n+2 . . . are transferred to and held in the MEM1, and the charges which the photoelectric conversion unit 201 stored in frame n+1, frame n+3 . . . are transferred to and held in the MEM2. "One frame" here indicates a period when charges corresponding to one READ operation are stored.

Charges stored in a certain frame are read from the charge holding unit in the next frame. Here such phrases as "charge holding unit during storing" and "charge holding unit during reading" are used. In the case of FIG. 4 and FIG. 5, MEM1 is the "charge holding unit during storing", and MEM2 is the "charge holding unit during reading" in frame n, frame n+2 In frame n+1, frame n+3 . . . , on the other hand, MEM2 is the "charge holding unit during storing", and MEM1 is the "charge holding unit during reading".

In the description of this embodiment, the charge holding units are alternately used, but such an alternate use is not absolute.

The functional effect of Embodiment 1 will be described with reference to FIG. 4 and FIG. 5.

Charges stored in PD in frame n are transferred from PD to MEM1 at timing (iii). In the charge holding period (including timings (i) and (ii)) in frame n, the potential under the gate of GS1 is set to GS_OFF1, and the potential under the gate of GS2 is set to GS_OFF2. Here GS_OFF1 and GS_OFF2 satisfy GS_OFF1<GS_OFF2.

GS_OFF1 and GS_OFF2 are examples of the first potential and the second potential in the present invention respectively.

Timing (i) indicates a state before PD is saturated. In other words, timing (i) is a state where the level of the potential is GS_OFF1>PD. In this state, signal charges do not exist in the MEM1, but in MEM2, signal charges in frame n−1 are held and are sequentially read from each row (it is assumed that the pixels in FIG. 4 and FIG. 5 are pixels in rows that are not yet read).

Timing (ii) indicates a state where PD is saturated and charges are flowing into MEM1.

If this were a conventional configuration, such as the prior art (Japanese Patent Application Publication No. 2017-103727), there is no difference between the potential barriers GS1 and GS2 (although there is a potential difference from the OFG gate), hence charges flow into MEM1 and MEM2 with approximate equality. To MEM1, signal charges are transferred in a period when the charges are flowing in (timing (iii)), hence a false signal is not generated even if the charges flow in, but in MEM2 which holds signal charges of a different period, the charges that flow in generate a false signal. In order to suppress the flow of charges into a charge holding unit (MEM2 in this case) during reading in the configuration disclosed in Japanese Patent Application Publication No. 2017-103727, the transfer transistor (GS1) corresponding to the charge holding unit during storing, can be left ON constantly, but in this case, dark current increases. It is also possible to increase the potential difference between the OFG gate and the GS gate in the configuration disclosed in Japanese Patent Application Publication No. 2017-103727, but for this, the potential of the OFG gate must be decreased since there is a limit to increasing the potential of the GS gate, and decreasing the potential of the OFG gate leads to a decrease in saturation capacity.

In this embodiment, on the other hand, the GS gate has two OFF values, and the potential under the GS gate, which is connected to the charge holding unit used for holding charges of a certain frame, has a lower value than the potential under the other GS gate. Therefore the flow of the charges into the charge holding unit that holds charges for a different period can be suppressed. Specifically, at the timing (ii), MEM1 is the charge holding unit used for holding charges in frame n, and the potential under GS1 is set to be lower than the potential under GS2. Thereby the flow of charges into MEM2 can be suppressed.

Timing (iii) is a state when GS1 is ON. Charges stored in PD are transferred to MEM1, and are mixed with the charges flowing into MEM1. This means that the saturation of a pixel is determined by the saturation capacity of MEM1, and not by the saturation capacity of PD. This aspect is also different from the conventional structure disclosed in the prior art, and since the saturation of the pixel is not influenced by the saturation capacity of PD, the area of MEM can be increased and the characteristics of saturation can be improved.

The above are a series of operations related to the transfers of frame n.

The operations related to the transfers of frame n+1 are the same as the transfer operations of frame n, except that charges are transferred to MEM2. In concrete terms, during the storing period (including timings (iv) and (v)), the potential under the gate of GS2 is set to GS_OFF1, and the potential under the gate of GS1 is set to GS_OFF2. Then at timing (v), GS2 is turned ON, and charges stored in PD are transferred to MEM2.

The above description is from the standpoint of the potential that exists under the GS gate, but may be described as follows from the standpoint of the potential that is applied under the GS gate. That is, in the period when the signal charges to be transferred to MEM1 are stored in PD (timing (i)), the potential of OFF1 is applied to the gate of GS1, and the potential of OFF2 is applied to GS2. In the period when the signal charges to be transferred to MEM2 are stored in PD (timing (iv)), the potential of OFF1 is applied to the gate of GS2, and the potential of OFF2 is applied to GS1. In the case of an embodiment where the signal charges are electrons and the transistors are N-type transistors, ON>OFF1>OFF2 is established (ON is the potential that is applied when GS is in the ON state). In the case of an embodiment where the signal charges are holes and the transistors are P-type transistors, on the other hand, ON<OFF1<OFF2 is established. OFF1 corresponds to the first potential in the present invention, and OFF2 corresponds to the second potential in the present invention.

As described above, by using the configuration of this embodiment, the false signals generated by the charges flowing into the charge holding unit, which is the problem of the prior art, can be suppressed.

Each pixel of the photoelectric conversion unit according to this embodiment includes two charge holding units, but may include three or more charge holding units. Each pixel includes a number of GS transfer units and TX transfer units in accordance with a number of charge holding units. In the case where a number of charge holding units is three or more, each charge holding unit may be sequentially used, or may be used according to a different sequence.

Embodiment 2

A photoelectric conversion apparatus according to Embodiment 2 will be described with reference to FIG. 6 to FIG. 10A and FIG. 10B.

Figure 6:
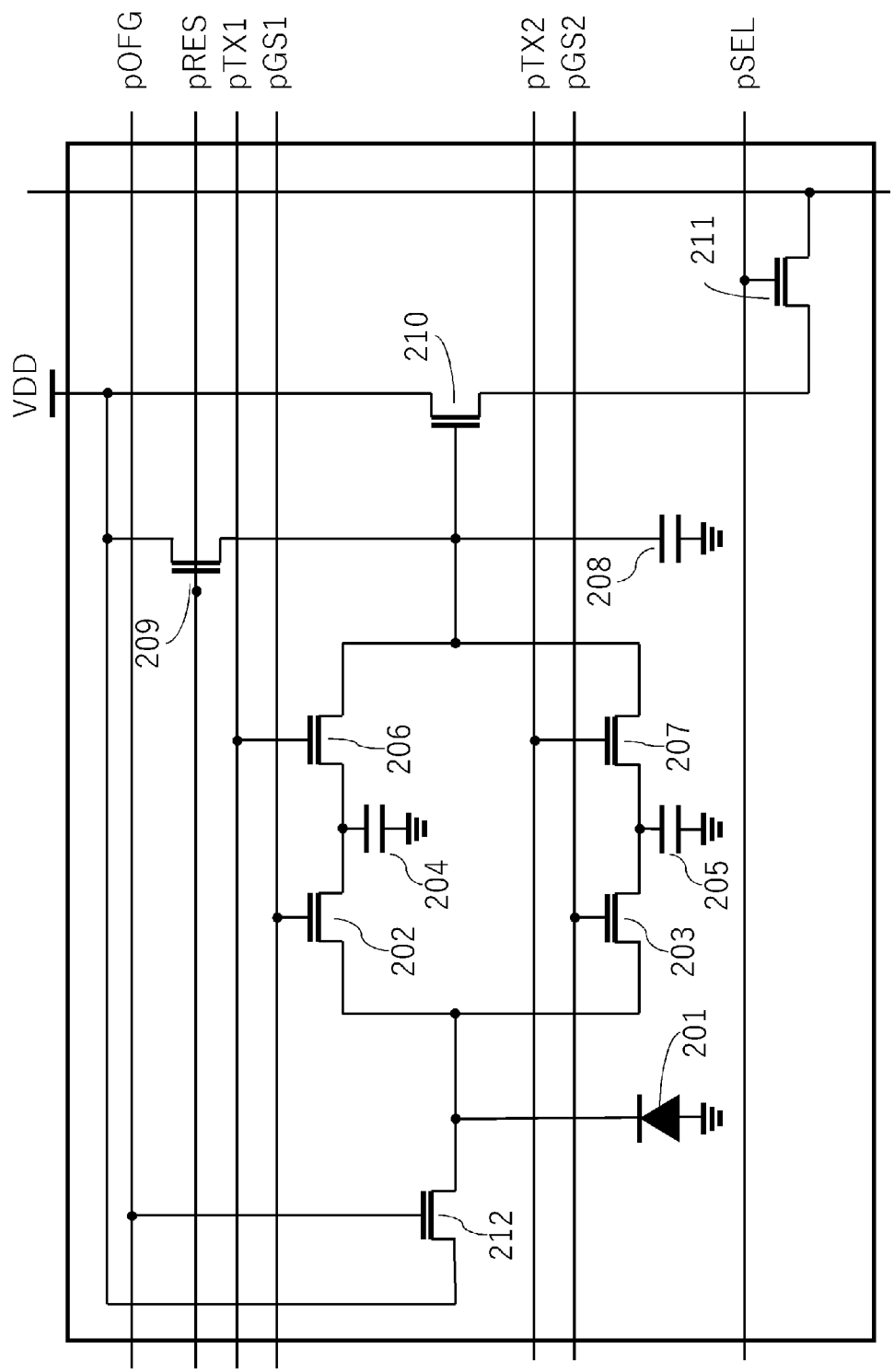
FIG. 6 is an equivalent circuit of a pixel unit according to Embodiment 2.

FIG. 6 indicates an equivalent circuit of a pixel of the photoelectric conversion apparatus according to Embodiment 2. A difference from Embodiment 1 is that an overflow unit 212 (OFG: overflow gate) is connected to PD, and the drain side of the overflow unit 212 is connected to the power supply potential VDD. By controlling the ON/OFF of the overflow unit 212, whether charges of the photoelectric conversion unit 201 are stored or not can be controlled. The overflow unit 212 is an example of the third gate according to the present invention.

Figure 7:
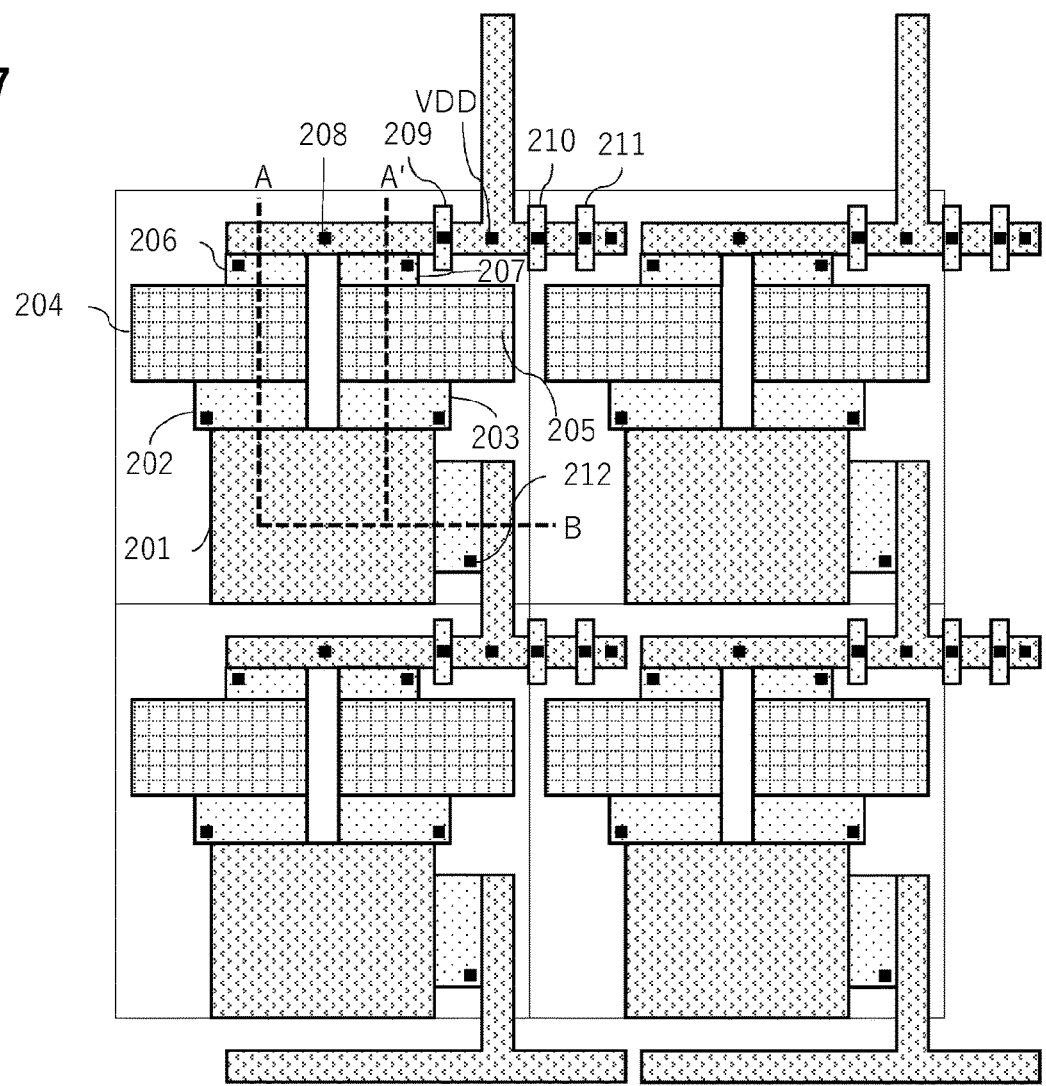
FIG. 7 is a pixel layout according to Embodiment 2.
Figure 8A:
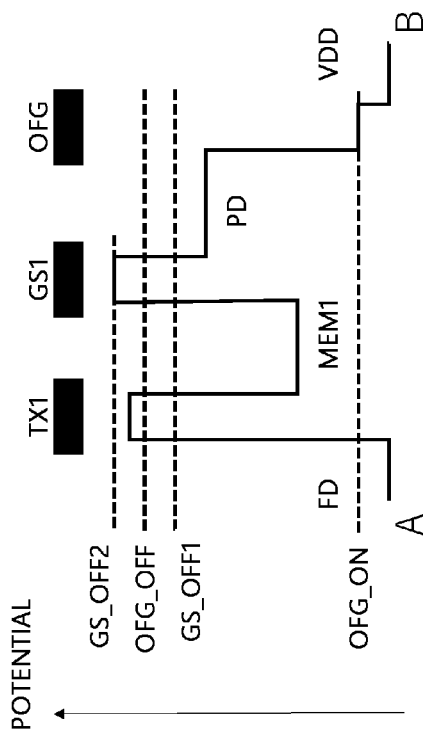
FIG. 8A and FIG. 8B are conceptual diagrams of the potential of the pixel unit according to Embodiment 2 (A-B cross-section)
Figure 8B:
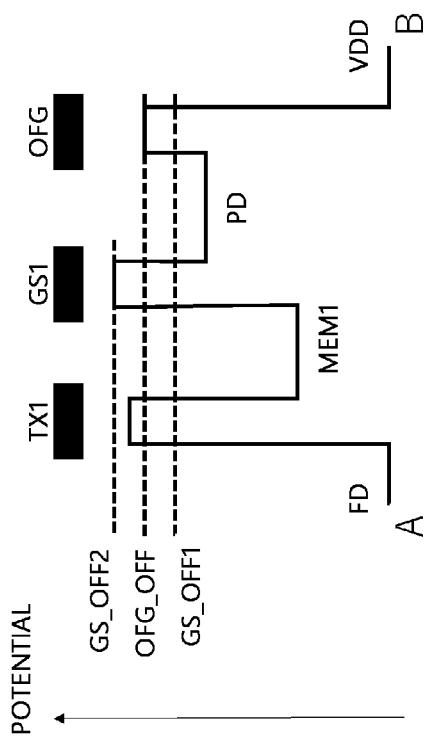

FIG. 7 indicates an example of the pixel layout according to Embodiment 2. FIG. 8A and FIG. 8B are conceptual diagrams of the potential of the A-B cross-section in FIG. 7. Here it is assumed that charges are stored in MEM2. FIG. 8A indicates the potential relationship when OFG is in the OFF state, and FIG. 8B indicates the potential relationship when OFG is in the ON state. The potential when OFG is in the OFF state is deeper than GS_OFF1, and shallower than GS_OFF2 (GS_OFF1<OFG_OFF<GS_OFF2). The potential when OFG is in the ON state is deeper than GS_OFF1 and GS_OFF2 (OFG_ON<GS_OFF1<GS_OFF2). OFG_OFF is an example of the third potential according to the present invention.

By establishing the above potential relationship when OFG is in the OFF state, the flow of the charges into the charge holding unit during read operation can be further suppressed. In other words, in probability, there are charges that surmount the potential barrier that is higher than GS_OFF1, but such charges are discharged via OFG of which potential OFG_OFF is lower than GS_OFF2, and the flow of charges into the charge holding unit during read operation can be suppressed.

When PD is storing charges, the storing time can be controlled by turning the OFG ON/OFF.

Figure 9:
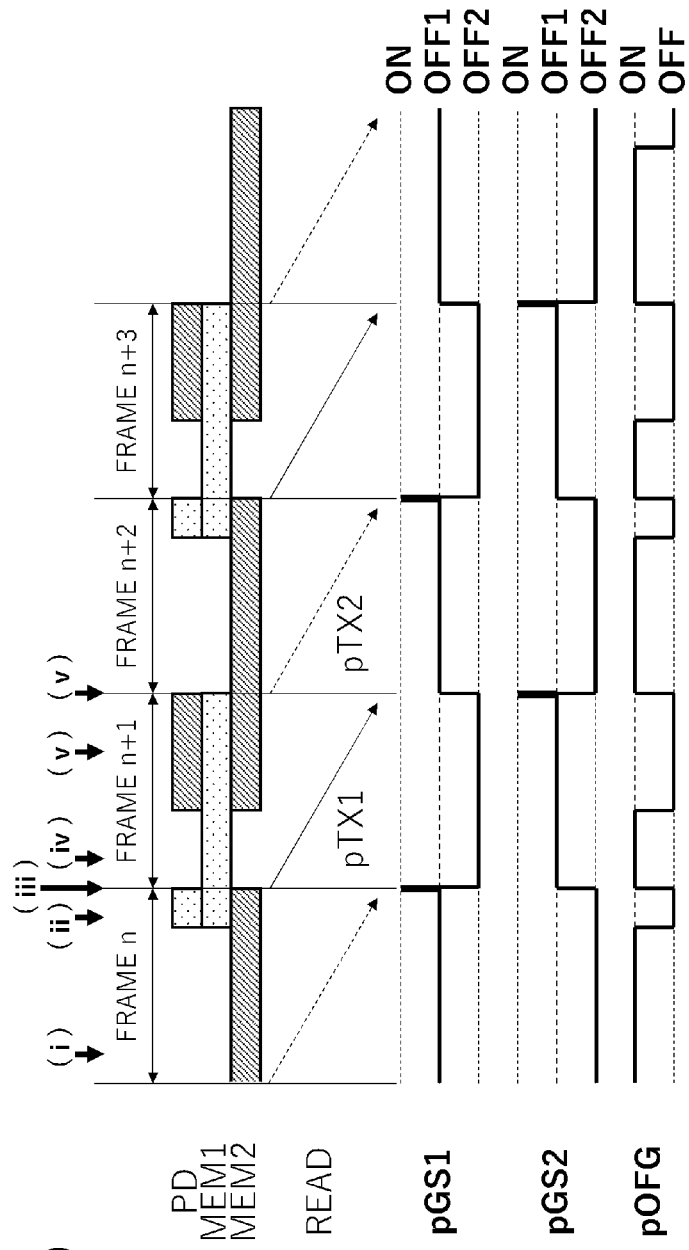
FIG. 9 is a pixel driving diagram according to Embodiment 2.

FIG. 9 indicates the drive timings of Embodiment 2. FIG. 9 also indicates the timings of a control signal pOFG of OFG, whereby the storing time of PD is controlled.

Figure 10A:
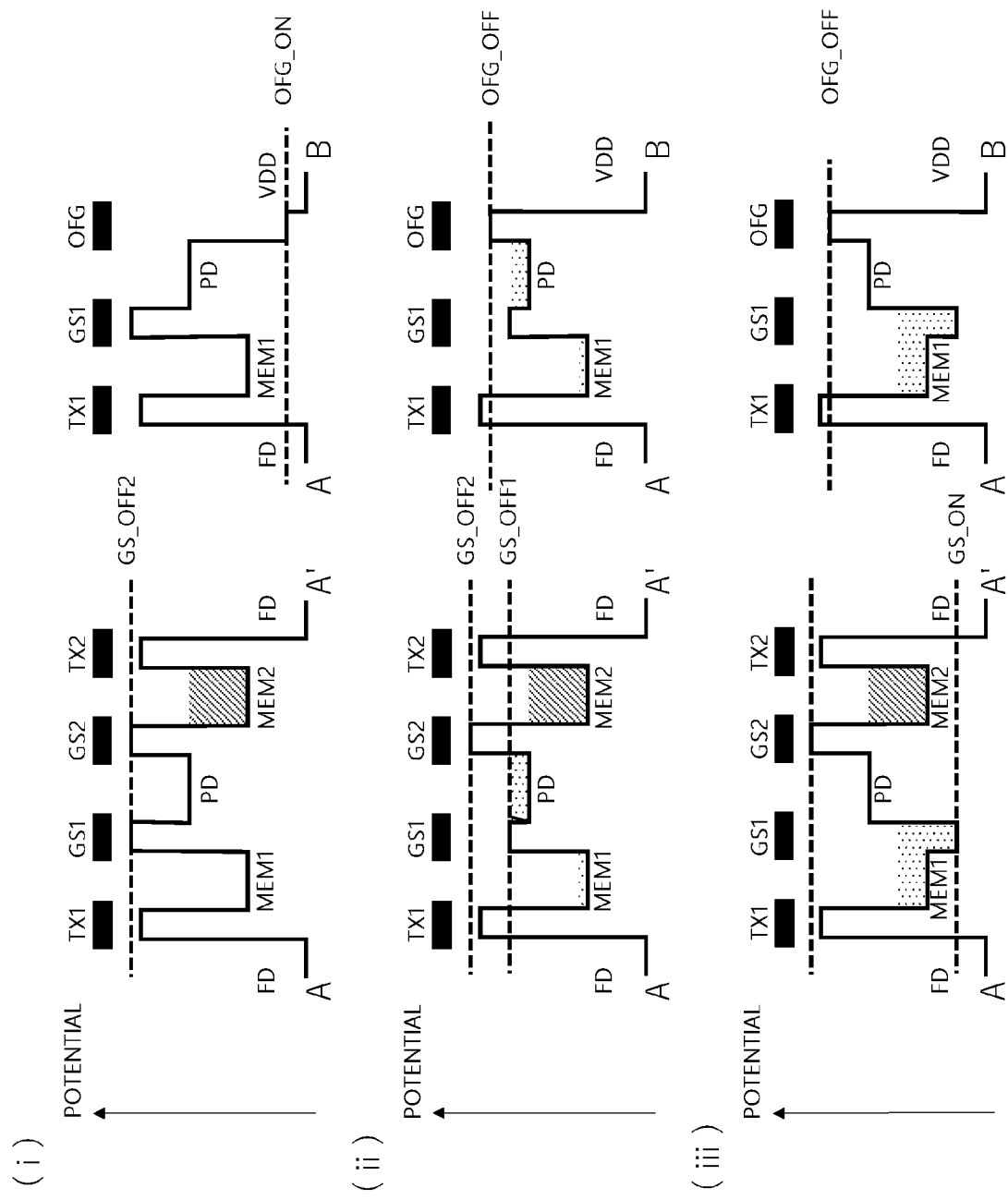
FIG. 10A is a conceptual diagram of the potential of the pixel according to Embodiment 2 (A-A' cross-section)
Figure 10B:
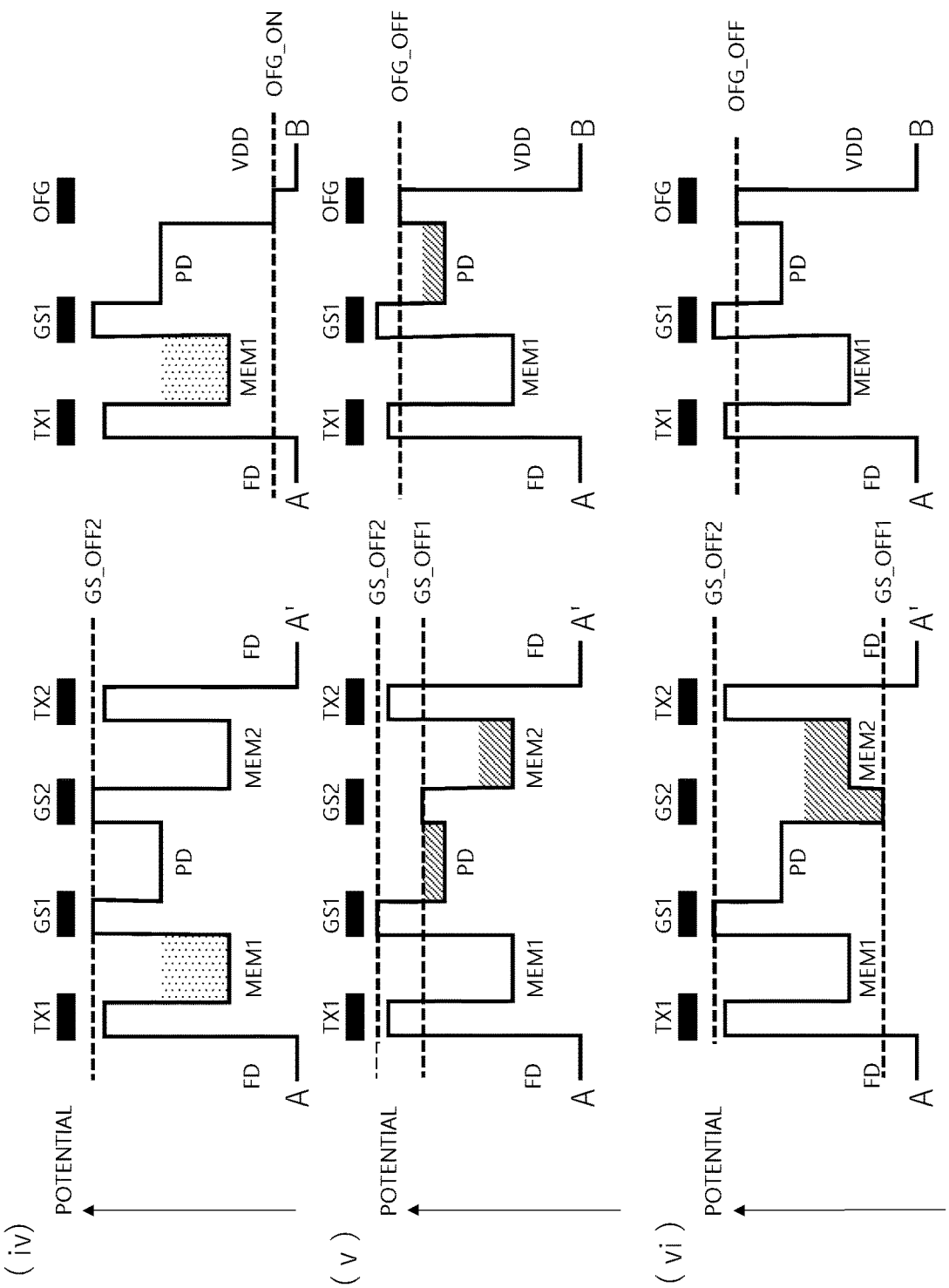
FIG. 10B is a conceptual diagram of the potential of the pixel according to Embodiment 2 (A-A' cross-section)

FIG. 10A and FIG. 10B are conceptual diagrams of the potential of the A-A' cross-section and the A-B cross-section in FIG. 7 at timings (i) to (vi) in FIG. 9. A difference from Embodiment 1 is that the driving of OFG is added and the non-storing period state is included. The timing (i) and timing (iv) correspond to the non-storing periods. In this period, it is desirable that OFG is in the ON state, and GS1 and GS2 are in the OFF2 state. This is because in OFF2, dark current becomes lower than in OFF1. Operation problems, however, are not generated even if one or both of GS1 and GS2 are in the OFF1 state.

In the storing period of the charges held in MEM1 (timing (ii)), the potential under the gate of GS1 is set to GS_OFF1, and the potential under the gate of GS2 is set to GS_OFF2, which is the same as Embodiment 1. In Embodiment 2, the potential under the gate of OFG is set to OFG_OFF (GS_OFF1<OFG_OFF<GS_OFF2) in the storing period, as mentioned above. At the timing to transfer the charges (iii), the potential under the gate of GS1 to set to GS_ON. The potentials under GS2 and OFG are maintained at GS-OFF2 and OFG_OFF.

The operation in the non-storing period in frame n+1 (timing (iv)) is the same as the operation in frame n. In the storing period (timing (v)) and the transfer period (timing (vi)) on the (n+1)th frame, the same control as frame n is performed, except that the roles of GS1 and GS2 are reversed.

As described above, in Embodiment 2 in which OFG is added, false signals are further controlled compared with Embodiment 1, and the storing time can also be controlled.

Embodiment 3

Figure 11:
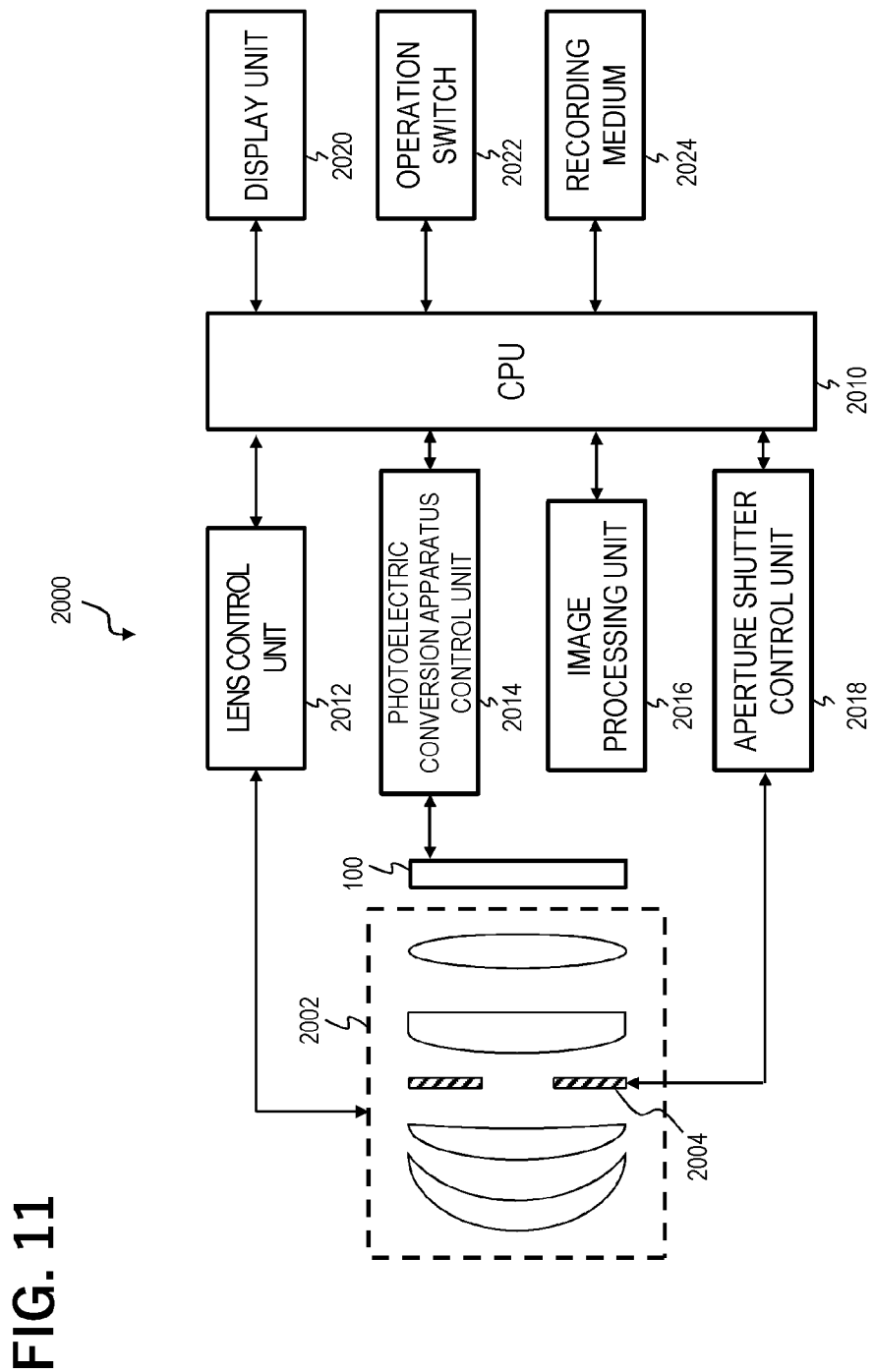
FIG. 11 is a diagram depicting a configuration example of an imaging system according to Embodiment 3.

An imaging system according to Embodiment 3 of the present invention will be described with reference to FIG. 11. FIG. 11 is a block diagram depicting a general configuration of an imaging system according to Embodiment 3.

The photoelectric conversion apparatus described in Embodiments 1 and 2 can be applied to various photoelectric conversion systems. The applicable photoelectric conversion systems are not especially limited, but includes various types of apparatuses, such as digital still cameras, digital camcorders, surveillance cameras, copiers, facsimiles, portable telephones, dashboard cameras, observation satellites and medical cameras. A camera module constituted of an optical system (e.g. lens) and the photoelectric conversion apparatus is also included in a photoelectric conversion system. FIG. 11 is a block diagram depicting a digital still camera (imaging system) as an example of these photoelectric conversion systems.

As illustrated in FIG. 11, the photoelectric conversion system 2000 includes the photoelectric conversion apparatus 100, an optical system 2002, a CPU 2010, a lens control unit 2012, a photoelectric conversion apparatus control unit 2014, an image processing unit 2016, and an aperture shutter control unit 2018. The photoelectric conversion system 2000 also includes a display unit 2020, an operation switch 2022 and a recording medium 2024.

The optical system 2002 is an optical system to form an optical image of an object, and includes a lens group and an aperture 2004. The aperture 2004 has a function to adjust the quantity of light when an image is captured, by adjusting the opening diameter thereof, and also has a function as a shutter to adjust exposure time when a still image is captured. The lens group and the aperture 2004 are retractably held along the optical axis, and a zooming function and focus adjustment function are implemented by the interlocking operation of these components. The optical system 2002 may be integrated with the imaging system, or may be an imaging lens that can be attached to the imaging system.

In the image space of the optical system 2002, the photoelectric conversion apparatus 100 is disposed so that the imaging surface is positioned in this space. The photoelectric conversion apparatus 100 is the photoelectric conversion apparatus described in Embodiments 1 and 2, and is constituted of the CMOS sensor (pixel unit) and peripheral circuits thereof (peripheral circuit region). In the photoelectric conversion apparatus 100, a plurality of pixels, including the photoelectric conversion unit, are two-dimensionally arranged, and color filters are disposed for these pixels, whereby a two-dimensional single-plate color sensor is constructed. The photoelectric conversion apparatus 100 performs photoelectric conversion on an object image formed by the imaging optical system 2002, and outputs the object image as image signals and focus detecting signals.

The lens control unit 2012 is for performing the zooming operation and focus adjustment by controlling the driving to move the lens group of the optical system 2002 backward and forward, and is constituted of the circuits and processors to implement this function. The aperture shutter control unit 2018 is for adjusting the quantity of light to capture an image by changing the opening diameter of the aperture 2004 (changing the aperture value), and is constituted of the circuits and processors to implement this function.

The CPU 2010 is a control unit in a camera which performs various controls of the camera main unit, and includes an arithmetic unit, ROM, RAM, A/D convertor, D/A convertor and a communication interface circuit. The CPU 2010 controls the operation of each component in the camera in accordance with the computer programs stored in the ROM and the like, and execute a series of image capturing operations, such as AF, including the detection of the focus state (focal detection) of the optical system 2002, image capturing, image processing and recording. The CPU 2010 is also a signal processing unit.

The photoelectric conversion apparatus control unit 2014 is for controlling the operation of the photoelectric conversion apparatus 100, A/D converting the signal outputted from the photoelectric conversion apparatus 100 and transmitting the converted signals to the CPU 2010, and is constituted of circuits and controllers to implement these functions. The photoelectric conversion apparatus 100 may include the A/D conversion function. The image processing unit 2016 is a processor to generate image signals by performing such image processing as y conversion and color interpolation on the A/D converted signals, and is constituted of circuits and controllers to implement this function. The display unit 2020 is a display device, such as a liquid crystal display (LCD), and displays information on the image capturing mode of the camera, a preview image before imaging capturing, a confirmation image after image capturing, focusing state during focal detection and the like. The operation switch 2022 is constituted of a power switch, release (image capturing trigger) switch, zoom operation switch, image capturing mode selection switch and the like. The recording medium 2024 is for recording a captured image and the like, and may be included in the imaging system or may be removably attached (e.g. memory card).

As described above, a high performance photoelectric conversion system can be implemented by constructing the photoelectric conversion system 2000 using the photoelectric conversion apparatus 100 according to Embodiment 1 or 2.

Embodiment 4

Figure 12A:
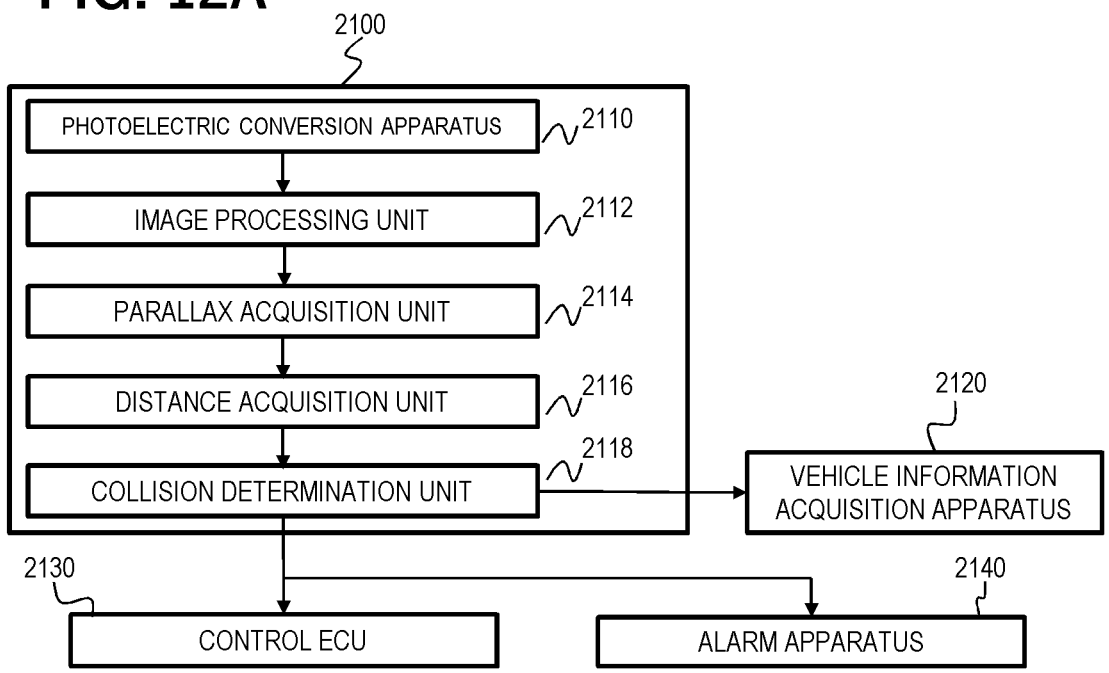
FIG. 12A and FIG. 12B are diagrams depicting configuration examples of an imaging system and a mobile body according to Embodiment 4.
Figure 12B:
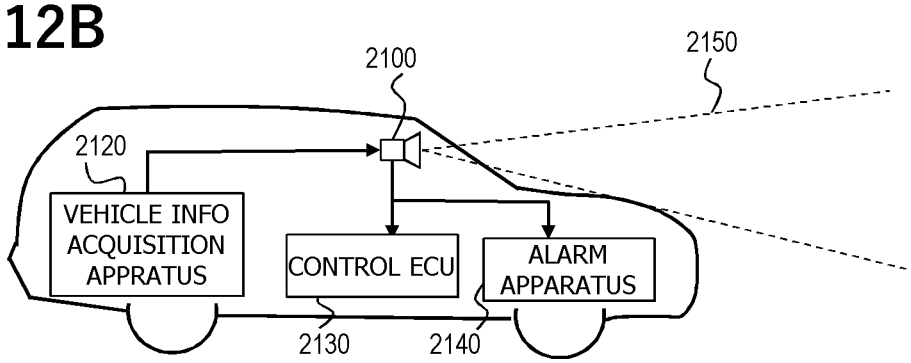

An imaging system and a mobile body according to Embodiment 4 of the present invention will be described with reference to FIG. 12A and FIG. 12B. FIG. 12A and FIG. 12B are diagrams depicting the configurations of the photoelectric conversion system (imaging system) and the mobile body according to Embodiment 4.

FIG. 12A indicates an example of a photoelectric conversion system 2100 related to a dashboard camera. The photoelectric conversion system 2100 includes the photoelectric conversion apparatus 2110. The photoelectric conversion apparatus 2110 is either one of the above mentioned photoelectric conversion apparatuses according to Embodiments 1 and 2. The photoelectric conversion system 2100 includes an image processing unit 2112 and a parallax acquisition unit 2114. The image processing unit 2112 is a processor that performs image processing on a plurality of image data acquired by the photoelectric conversion apparatus 2110. The parallax acquisition unit 2114 is a processor that calculates the parallax (phase difference of parallax images) from the plurality of image data acquired by the photoelectric conversion apparatus 2110. The photoelectric conversion system 2100 also includes a distance acquisition unit 2116, which is a processor that calculates the distance to the object based on the calculated parallax, and a collision determination unit 2118, which is a processor that determines the possibility of collision based on the calculated distance. Here the parallax acquisition unit 2114 and the distance acquisition unit 2116 are examples of an information acquisition unit that acquires information, such as distance information to the object. In other words, the distance information is information related to the parallax, defocus amount, distance to the object and the like. The collision determination unit 2118 may determine the possibility of collision using any of this distance information. The above mentioned processor may be implemented by dedicated hardware that is designed for this processor, or may be implemented by standard hardware which performs operations based on software modules. The processor may be implemented by a field programmable gate array (FPGA), an application specific integrated circuit (ASIC) or the like, or may be implemented by a combination thereof.

The photoelectric conversion system 2100 is connected with a vehicle information acquisition apparatus 2120, whereby such vehicle information as vehicle speed, yaw rate and steering angle can be acquired. The photoelectric conversion system 2100 is connected to a control ECU 2130, which is a controller that outputs a control signal to generate a braking force on the vehicle based on the determination result by the collision determination unit 2118. In other words, the control ECU 2130 is an example of a mobile body control unit that controls a mobile body based on the distance information. The photoelectric conversion system 2100 is also connected to an alarm apparatus 2140 that emits an alarm to the driver based on the determination result by the collision determination unit 2118. For example, if the possibility of collision is high based on the determination of the collision determination unit 2118, the control ECU 2130 performs vehicle controls to prevent collision and minimize damage, by applying the breaks, releasing the accelerator or suppressing the engine output, for example. The alarm apparatus 2140 emits an alarm to the user by outputting an alarm sound, displaying warning information on the screen of the car navigation system, or vibrating the seat belt or steering wheel, for example.

In Embodiment 4, the peripheral area of the vehicle (e.g. forward area, rear area) is imaged by the photoelectric conversion system 2100. FIG. 12B indicates the photoelectric conversion system 2100 in the case of imaging the forward area of the vehicle (imaging range 2150). The vehicle information acquisition apparatus 2120 activates the photoelectric conversion system 2100 and sends an instruction to the photoelectric conversion system 2100 to execute the imaging. By using the above mentioned photoelectric conversion apparatus according to Embodiment 1 or 2 as the photoelectric conversion apparatus 2110, the photoelectric conversion system 2100 of Embodiment 4 can further improve the accuracy of distance measurement.

In the example described above, control is performed to prevent collision with another vehicle, but the present invention may be applied to a control for automatic driving following another vehicle, a control for automatic driving so as to prevent deviating from the driving lane and the like. Further, applying this imaging system is not limited to such a vehicle as an automobile, but may be applied to a ship, airplane or a mobile body (transport apparatus), such as an industrial robot. A moving device used for a mobile body (transport apparatus) refers to such a drive source as an engine, motor, wheels and propeller. Application of the present invention is not limited to a mobile body, but may be a wide range of apparatuses that use object recognition, such as an intelligent transport system (ITS).

OTHER EMBODIMENTS

The photoelectric conversion apparatus may have a structure where a first semiconductor chip on which pixels are disposed and a second semiconductor chip on which a read circuit (amplifier) are disposed are stacked (stacked chip structure). The read circuit (amplifier) on the second semiconductor chip may have column circuits which correspond to the pixel columns of the first semiconductor chip respectively. The read circuit (amplifier) on the second semiconductor chip may have matrix circuits which correspond to the pixels or pixel blocks of the first semiconductor chip respectively. Connection between the first semiconductor chip and the second semiconductor chip may, for example, be through-silicon via (TSV), inter-chip wiring based on direct bonding of such metal as copper (Cu), or inter-chip connection using micro bumps.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-018988, filed on Feb. 5, 2019 which is hereby incorporated by reference herein in its entirety.

What is claimed is:

1. A photoelectric conversion apparatus comprising a plurality of pixels,
    wherein each of the pixels includes:
        a photoelectric conversion unit that stores charges generated by photoelectric conversion;
        a first charge holding unit;
        a second charge holding unit;
        a first gate configured to transfer charges stored in the photoelectric conversion unit to the first charge holding unit; and
        a second gate configured to transfer charges stored in the photoelectric conversion unit to the second charge holding unit,
    wherein, in a period when the photoelectric conversion unit is storing charges to be transferred to the first charge holding unit, a potential of the first gate is set to a first potential, and a potential of the second gate is set to a second potential,
    wherein both the first potential and the second potential are higher than a potential of the first gate in a period when the charges of the photoelectric conversion unit are transferred to the first charge holding unit and a potential of the second gate in a period when the charges of the photoelectric conversion unit are transferred to the second charge holding unit, and
    wherein the first potential is lower than the second potential.

2. The photoelectric conversion apparatus according to claim 1, further comprising a third gate that connects the photoelectric conversion unit to a power supply potential,
    wherein storing of charges in the photoelectric conversion unit is controlled by the ON/OFF of the third gate.

3. The photoelectric conversion apparatus according to claim 2, wherein, in the period when the photoelectric conversion unit is storing charges to be transferred to the first charge holding unit, the potential of the third gate is set to a third potential that is higher than the first potential and is lower than the second potential.

4. The photoelectric conversion apparatus according to claim 2, wherein, in a period when the third gate is ON, both the potential of the first gate and the potential of the second gate are set to the second potential.

5. The photoelectric conversion apparatus according to claim 1,
    wherein an operation of storing charges in the photoelectric conversion unit and transferring the charges to the first charge holding unit, and an operation of storing charges in the photoelectric conversion unit and transferring the charges to the second charge holding unit are performed alternately,
    wherein in the period when the photoelectric conversion unit is storing charges to be transferred to the first charge holding unit, the potential of the first gate is set to the first potential and the potential of the second gate is set to the second potential, and
    wherein in the period when the photoelectric conversion unit is storing charges to be transferred to the second charge holding unit, the potential of the second gate is set to the first potential, and the potential of the first gate is set to the second potential.

6. The photoelectric conversion apparatus according to claim 1, wherein the photoelectric conversion unit stores charges at a same timing in each of the plurality of pixels.

7. The photoelectric conversion apparatus according to claim 1, wherein each of the plurality of pixels further includes:
    a floating diffusion node;
    a fourth gate configured to transfer the charges held in the first charge holding unit to the floating diffusion node;
    a fifth gate configured to transfer the charges held in the second charge holding unit to the floating diffusion node; and
    an output unit configured to output a signal based on the charges transferred to the floating diffusion node.

8. A photoelectric conversion system comprising:
    the photoelectric conversion apparatus according to claim 1; and
    a signal processing unit configured to process a signal outputted from the photoelectric conversion apparatus.

9. A mobile body comprising:
    the photoelectric conversion apparatus according to claim 1;
    a mobile apparatus;
    a processor configured to acquire information from a signal outputted from the photoelectric conversion apparatus; and
    a controller configured to control the mobile apparatus based on this information.

10. A photoelectric conversion apparatus comprising a plurality of pixels,
    wherein each of the pixels includes:
        a photoelectric conversion unit that stores electrons generated by photoelectric conversion;
        a first charge holding unit;
        a second charge holding unit;
        a first gate configured to transfer electrons stored in the photoelectric conversion unit to the first charge holding unit; and
        a second gate configured to transfer electrons stored in the photoelectric conversion unit to the second charge holding unit, wherein in a period when the photoelectric conversion unit is storing electrons to be transferred to the first charge holding unit, a potential of the first gate is set to a first potential, and a potential of the second gate is set to a second potential, wherein both the first potential and the second potential are potentials lower than a potential of the first gate in a period when the electrons of the photoelectric conversion unit are transferred to the first charge holding unit and a potential of the second gate in a period when the electrons of the photoelectric conversion unit are transferred to the second charge holding unit, and wherein the first potential is higher than the second potential.

11. A photoelectric conversion apparatus comprising a plurality of pixels, wherein each of the pixels includes:
a photoelectric conversion unit that stores holes generated by photoelectric conversion;
a first charge holding unit;
a second charge holding unit;
a first gate configured to transfer holes stored in the photoelectric conversion unit to the first charge holding unit; and
a second gate configured to transfer holes stored in the photoelectric conversion unit to the second charge holding unit, wherein in a period when the photoelectric conversion unit is storing holes to be transferred to the first charge holding unit, a potential of the first gate is set to a first potential, and a potential of the second gate is set to a second potential, wherein both the first potential and the second potential are potentials higher than a potential of the first gate in a period when the holes of the photoelectric conversion unit are transferred to the first charge holding unit, and a potential of the second gate in a period when the holes of the photoelectric conversion unit are transferred to the second charge holding unit, and wherein the first potential is lower than the second potential.

12. A photoelectric conversion apparatus comprising a plurality of pixels, wherein each of the pixels includes:
a photoelectric conversion unit that stores charges generated by photoelectric conversion;
a first charge holding unit;
a second charge holding unit;
a first transistor being a N-type transistor, and having a first gate configured to transfer charges stored in the photoelectric conversion unit to the first charge holding unit; and
a second transistor being a N-type transistor, and having a second gate configured to transfer charges stored in the photoelectric conversion unit to the second charge holding unit, wherein in a period when the photoelectric conversion unit is storing charges to be transferred to the first charge holding unit, a voltage of the first gate is set to a first voltage, and a voltage of the second gate is set to a second voltage, wherein both the first voltage and the second voltage are voltages higher than a voltage of the first gate in a period when the electrons of the photoelectric conversion unit are transferred to the first charge holding unit and a voltage of the second gate in a period when the electrons of the photoelectric conversion unit are transferred to the second charge holding unit, and wherein the first voltage is lower than the second voltage.

13. The photoelectric conversion apparatus according to claim 12, further comprising a third transistor being a N-type transistor, and having a third gate that connects the photoelectric conversion unit to a power supply potential, wherein storing of charges in the photoelectric conversion unit is controlled by the ON/OFF of the third gate.

14. The photoelectric conversion apparatus according to claim 13, wherein, in the period when the photoelectric conversion unit is storing charges to be transferred to the first charge holding unit, a voltage of the third gate is set to a third voltage that is higher than the first voltage and is lower than the second voltage.

15. The photoelectric conversion apparatus according to claim 13, wherein, in a period when the third gate is ON, both the voltage of the first gate and the voltage of the second gate are set to the second voltage.

16. The photoelectric conversion apparatus according to claim 12, wherein an operation of storing charges in the photoelectric conversion unit and transferring the charges to the first charge holding unit, and an operation of storing charges in the photoelectric conversion unit and transferring the charges to the second charge holding unit are performed alternately, wherein in the period when the photoelectric conversion unit is storing charges to be transferred to the first charge holding unit, the potential of the first gate is set to the first potential and the potential of the second gate is set to the second potential, and wherein in the period when the photoelectric conversion unit is storing charges to be transferred to the second charge holding unit, the potential of the second gate is set to the first potential, and the potential of the first gate is set to the second potential.

17. The photoelectric conversion apparatus according to claim 12, wherein the photoelectric conversion unit stores charges at a same timing in each of the plurality of pixels.

18. The photoelectric conversion apparatus according to claim 12, wherein each of the plurality of pixels further includes:
a floating diffusion node;
a fourth gate configured to transfer the charges held in the first charge holding unit to the floating diffusion node;
a fifth gate configured to transfer the charges held in the second charge holding unit to the floating diffusion node; and
an output unit configured to output a signal based on the charges transferred to the floating diffusion node.

19. A photoelectric conversion system comprising:
the photoelectric conversion apparatus according to claim 12; and
a signal processing unit configured to process a signal outputted from the photoelectric conversion apparatus.

20. A mobile body comprising:
the photoelectric conversion apparatus according to claim 12;
a mobile apparatus;
a processor configured to acquire information from a signal outputted from the photoelectric conversion apparatus; and
a controller configured to control the mobile apparatus based on this information.

21. A photoelectric conversion apparatus comprising a plurality of pixels, wherein each of the pixels includes:
a photoelectric conversion unit that stores charges generated by photoelectric conversion;

a first charge holding unit;

a second charge holding unit;

a first transistor being a P-type transistor, and having a first gate configured to transfer charges stored in the photoelectric conversion unit to the first charge holding unit; and a second transistor being a P-type transistor, and having a second gate configured to transfer charges stored in the photoelectric conversion unit to the second charge holding unit, wherein in a period when the photoelectric conversion unit is storing charges to be transferred to the first charge holding unit, a voltage of the first gate is set to a first voltage, and a voltage of the second gate is set to a second voltage, wherein both the first voltage and the second voltage are voltages lower than a voltage of the first gate in a period when the electrons of the photoelectric conversion unit are transferred to the first charge holding unit and a voltage of the second gate in a period when the electrons of the photoelectric conversion unit are transferred to the second charge holding unit, and wherein the first voltage is higher than the second voltage.

22. The photoelectric conversion apparatus according to claim 21, wherein the photoelectric conversion unit stores charges at a same timing in each of the plurality of pixels.

23. The photoelectric conversion apparatus according to claim 21, wherein each of the plurality of pixels further includes:

a floating diffusion node;

a fourth gate configured to transfer the charges held in the first charge holding unit to the floating diffusion node;

a fifth gate configured to transfer the charges held in the second charge holding unit to the floating diffusion node; and an output unit configured to output a signal based on the charges transferred to the floating diffusion node.

24. A photoelectric conversion system comprising:

the photoelectric conversion apparatus according to claim 21; and a signal processing unit configured to process a signal outputted from the photoelectric conversion apparatus.

25. A mobile body comprising:

the photoelectric conversion apparatus according to claim 21;

a mobile apparatus;

a processor configured to acquire information from a signal outputted from the photoelectric conversion apparatus; and a controller configured to control the mobile apparatus based on this information.

* * * * *